United States Patent
Bean et al.

(10) Patent No.: US 6,400,123 B1
(45) Date of Patent: Jun. 4, 2002

(54) BATTERY FUEL GAUGING USING BATTERY CHEMISTRY IDENTIFICATION

(75) Inventors: Heather N. Bean; Christopher Whitman, both of Fort Collins, CO (US)

(73) Assignee: Hewlett-Packard Company, Palo Alto, CA (US)

( * ) Notice: Subject to any disclaimer, the term of this patent is extended or adjusted under 35 U.S.C. 154(b) by 0 days.

(21) Appl. No.: 09/943,058

(22) Filed: Aug. 29, 2001

(51) Int. Cl.[7] .................... H01M 10/46; H01M 10/44
(52) U.S. Cl. .................................................. 320/132
(58) Field of Search .................................. 320/124, 125, 320/132, DIG. 18, DIG. 19, DIG. 21; 324/425, 426, 432, 438

(56) References Cited

U.S. PATENT DOCUMENTS

| 5,352,968 A | 10/1994 | Reni et al. ..................... 320/50 |
| 5,455,499 A | 10/1995 | Uskall et al. .................. 320/43 |
| 5,656,917 A | 8/1997 | Theobald ....................... 320/22 |
| 5,656,920 A | 8/1997 | Cherng et al. ................. 320/31 |
| 5,739,596 A | 4/1998 | Takizawa et al. ............. 307/66 |
| 5,818,197 A | 10/1998 | Miller et al. ................. 320/107 |
| 5,844,884 A | 12/1998 | Szlenski ....................... 370/149 |
| 5,883,497 A | 3/1999 | Turnbull ....................... 320/132 |
| 5,889,385 A | 3/1999 | Podrazhansky et al. .... 320/130 |
| 5,965,998 A | 10/1999 | Whiting et al. ............. 320/165 |
| 5,998,972 A | 12/1999 | Gong ........................ 320/134 |
| 6,087,808 A | * 7/2000 | Pritchard |
| 6,152,597 A | * 11/2000 | Potega |

* cited by examiner

Primary Examiner—Edward H. Tso

(57) ABSTRACT

An apparatus and a method adapt fuel gauging to a battery chemistry in an electronic device having a battery. The method comprises determining the battery chemistry of the battery and adapting the fuel gauging to the determined battery chemistry. The method can further utilize operational mode information about the electronic device for the fuel gauging. The apparatus comprises a battery monitor and a controller. The controller implements the method. An electronic device having adaptive fuel gauging according to the present invention is also provided. Adapting to battery chemistry can improve the accuracy and efficacy of fuel gauging in the electronic device when the device accepts and operates using any one of a plurality of different battery chemistries.

23 Claims, 4 Drawing Sheets

BATTERY FUEL GAUGING USING BATTERY CHEMISTRY IDENTIFICATION

CROSS REFERENCE TO RELATED APPLICATION

The present invention is related to co-pending patent application of Bean et al., entitled "A Method Of Battery Chemistry Identification Through Analysis Of Voltage Behavior", Ser. No. 09/859,015, filed May 14, 2001, which is incorporated by reference in its entirety herein. The present invention and the co-pending application have the same assignee.

TECHNICAL FIELD

The invention relates to battery powered electronic devices. In particular, the invention relates to battery fuel gauging for indicating an amount of charge remaining in a battery.

BACKGROUND OF THE INVENTION

Electronic devices that derive some or all of their operating power from a battery are popular, widely available, and in widespread use. Many of these so-called battery powered electronic devices would be much less marketable without the availability of reliable battery power. In fact, many popular portable electronic devices, such as notebook and laptop computers, hand-held computers and personal digital assistants (PDAs), digital cameras, and cellular telephones, would be of little or no use without a reliable and dependable battery power supply.

Many battery powered electronic devices provide a battery 'fuel gauge' to keep the user informed regarding the reliability of the battery power. A battery fuel gauge is an indicator that shows remaining energy capacity or charge level of the battery. The fuel gauge is intended to keep a user of the device informed of a current or remaining battery charge level and, by extension, a probable remaining operating time of the electronic device. In addition, the fuel gauge, or more precisely, data collected by the electronic device and used to generate the fuel gauge, is often used to determine whether or not a predetermined cut-off point in a discharge profile of the battery has been reached. The cut-off point is a point in the battery discharge profile beyond which adequate power may not be available to insure proper device operation. By detecting if and when the cut-off point has been reached, the device can, among other things, initiate a 'soft shut-down'. Such a device initiated soft-shut down can help to prevent or at least mitigate various inopportune or inconvenient consequences of an unexpected loss of adequate operational power at or near an 'end of discharge' of the battery.

While having an accurate battery fuel gauge is useful for and enhances the reliability of battery power supplies for electronic devices, generally implementing such a fuel gauge is not a simple, straightforward task. Simply put, there is no direct means of determining or measuring the current charge level of a battery. Therefore, battery fuel gauging generally employs an indirect approach. Instead of directly measuring charge level, battery fuel gauges generally attempt to predict or infer the charge level from measurements of the dynamic electrical behavior or characteristics of the battery. In most cases, fuel gauging is based on monitoring battery characteristics, such as battery voltage or battery current, as a function of time. The measured data from monitoring one or more of these battery characteristics are then translated into a fuel gauge reading or result using a fuel gauge algorithm.

Unfortunately, the problem of battery fuel gauging is made even more difficult in devices capable of accepting and utilizing batteries of any one of different battery chemistries. In simple terms, a battery is a device that converts chemical energy into electrical energy or electricity. The 'chemistry' of the battery refers to the specific combination of electrolytes and electrode materials used in the battery to create and sustain chemical reactions within the battery that produce electricity. A variety of different battery chemistries are currently commercially available including alkaline, high-energy alkaline, nickel-metal hydride (NiMH), nickel-cadmium (NiCd), and photo lithium or lithiumn-iron sulfide (Li—$FeS_2$). Moreover, all of these chemistries are available in a variety of common battery sizes or form factors, including, but not limited to, an 'AA' size.

The chemistry of a battery is relevant to fuel gauging because of a direct relationship between the chemical reactions and the electrical characteristics of the battery. Essentially all measurable electrical characteristics of a given battery, including but not limited to, open-circuit voltage, loaded voltage, charge capacity, peak current and even re-chargeability are a direct result of the specific chemical reactions taking place within the battery. The unique qualities of a battery's chemical reaction, such as reaction rate, reaction path, and reactants involved, are sometimes referred to collectively as the 'reaction kinetics' or simply 'kinetics' of the battery. The reaction kinetics of the battery dictate the electrical characteristics of the battery. Thus, any of the electrical characteristics of the battery that might be usefully monitored for fuel gauging will be directly affected by or depend on the battery chemistry.

For example, the open-circuit voltages at full charge, mid charge and end of discharge can and do differ from one chemistry to another. In addition, peak current levels and internal resistance levels differ among the various chemistries, leading to different measured voltages when the batteries are placed under a load. Thus, a fuel gauging approach designed or 'calibrated' for one chemistry may not be particularly accurate or effective for another battery chemistry even in the same form factor.

Despite these problems, most battery powered electronic devices employ one of two methodologies in conjunction with monitoring batteries and providing fuel gauging: current monitoring or voltage slope monitoring. Current monitoring, sometimes called power monitoring, determines the energy capacity remaining in a battery by monitoring the power or current passing into and out of the battery. Current monitoring requires knowledge of the approximate amount of energy that can be drained from the battery before it is fully discharged. As such, the use of power/current monitoring is generally restricted to electronic devices that utilize a battery having known characteristics such as an application-specific battery pack. An application-specific battery pack is typically manufactured and/or distributed under the control of a manufacturer of the electronic device. Therefore, the manufacturer can control the battery pack specifications and thus effectively has some considerable control over the accuracy of the battery monitoring and fuel gauging system. Essentially, the fuel gauge can be calibrated based on a priori knowledge of the application-specific battery pack performance characteristics and chemistry.

Because a priori knowledge of battery characteristics is not available to devices that accept multiple battery chemistries (i.e., devices that do not use an application-specific battery pack), generally the current monitoring approach is not used for fuel gauging in these devices. Instead, these devices generally employ the second methodology, voltage slope monitoring. Voltage slope monitoring monitors a change in battery voltage over a change in time (dv/dt) during battery discharge. The change in voltage with respect to time (dv/dt) is referred to as the voltage slope of the battery. If the voltage slope characteristics are known for a given battery chemistry, a reasonably accurate prediction can generally be made regarding charge level based on a measured voltage at various points during the discharge cycle of the battery. Therefore, a periodic measurement of the battery voltage can be used to monitor the battery and provide battery fuel gauging for the electronic device.

In devices designed to work with any one of multiple battery chemistries, the battery chemistry may not be known a priori. In such multi-chemistry situations, the battery fuel gauge is generally designed to accommodate a lowest common denominator among the potential battery chemistries. In most cases, the fuel gauge is simply calibrated for the battery chemistry most likely to be commonly used in the device. As a result, while the fuel gauge may be relatively accurate for the calibrated battery chemistry, the fuel gauge may be grossly inaccurate for other chemistries. In other words, the accuracy of such a fuel gauge directly depends on the battery chemistry being used at a given moment.

Consider, for example, a fuel gauge in an electronic device using voltage slope monitoring that has been calibrated for alkaline batteries. If lithium-iron disulfide (Li—$FeS_2$, i.e., photo lithium) batteries are used in the device instead of alkaline batteries, the fuel gauge can report the lithium-iron disulfide batteries as having 100% charge up to a point at which the lithium-iron disulfide batteries are approximately 90% discharged. Thus, calibrating for alkaline batteries and using photo lithium batteries can result in a grossly inaccurate fuel gauge reading due to an incorrect assumption with regard to the battery chemistry.

As another example, consider another device having a voltage slope based fuel gauge that is calibrated for NiMH batteries. If, instead of NiMH batteries, alkaline batteries are used, the fuel gauge can report the alkaline batteries as being fully charged until they are approximately 80% discharged. Again, the fuel gauge produces grossly inaccurate results when a battery chemistry other than the calibrated-for chemistry is used in the device. Attempting to design the fuel gauge in a way that spreads the inaccuracy among the various battery chemistries does not generally improve the situation. Typically, this approach merely insures that the fuel gauge is inaccurate for all battery chemistries.

Accordingly, it would be advantageous to have fuel gauging for battery powered electronic devices, wherein the fuel gauging accuracy is not dependant on choosing a battery having any one particular battery chemistry. Such fuel gauging would solve a long-felt need in the area of battery powered electronic devices.

SUMMARY OF THE INVENTION

The present invention is a method of adaptive fuel gauging, an adaptive fuel gauge apparatus, and an electronic device having adaptive fuel gauging. The present invention employs battery chemistry identification to improve the accuracy and efficacy of fuel gauging in electronic devices having a battery that accept any one of a plurality of battery chemistries. In addition, the present invention utilizes operational mode information from the electronic device to further improve the fuel gauging. The combination of battery chemistry determination and operational mode fuel gauge adaptation yield more accurate fuel gauging for the electronic device than conventional fuel gauging techniques. Moreover, the present invention can better detect whether the battery has reached a cut-off point, thereby enabling a given battery to be drained to a more optimal discharge voltage level.

In one aspect of the present invention, a method of adaptive fuel gauging in an electronic device having a battery is provided. The device accepts any one of a plurality of different battery chemistries for the battery. The method of fuel gauging comprises determining the battery chemistry of the battery and adapting battery fuel gauging to the determined battery chemistry. In one or more embodiments, the method of fuel gauging further comprises monitoring a characteristic of the battery and generating a fuel gauge reading or result based on the monitored characteristic and the determined battery chemistry. In one or more of the embodiments, the method further comprises determining an operational mode of the electronic device. When the operational mode is determined, the generated fuel gauge reading also is based on the determined mode. Among other things, the generated result can be used to create a fuel gauge display and detect whether or not a cut-off point in the battery discharge profile has been reached.

In another aspect of the present invention, an adaptive fuel gauge apparatus for use in conjunction with an electronic device having a battery is provided. The device accepts any one of a plurality of different battery chemistries for the battery. The fuel gauge apparatus comprises a battery monitor and a controller. The battery monitor monitors a characteristic of the battery and generates measured data. The controller receives the measured data and implements adaptive fuel gauging. The adaptive fuel gauging comprises a fuel gauge reading, a determined chemistry of the battery, and optionally a determined operational mode. The fuel gauge reading is a function of the measured data, the determined battery chemistry and the optionally determined operational mode. Preferably, the controller implements the method of the present invention.

In another aspect of the invention, an electronic device with adaptive fuel gauging is provided. The electronic device has a battery and is capable of using any one of a plurality of different battery chemistries. The electronic device comprises a battery monitor, a controller, a memory, a user interface and a computer program stored in the memory that implements the adaptive fuel gauging. The battery monitor monitors a characteristic of the battery and outputs measured data to the controller. The controller executes the computer program comprising instructions that determine a chemistry of the battery, adapt the fuel gauging to the determined chemistry, and generate a fuel gauge result at the user interface from data for the measured battery characteristic based on the adaptation. In one or more embodiments, the computer program further comprises instructions that determine an operational mode of the device when the data are measured, and further adapt the fuel gauging to the determined operational mode. Preferably, the computer program comprises instructions that implement the method of the present invention. Advantageously in some cases, the adaptive fuel gauging of the present invention can be implemented as a firmware upgrade to an existing electronic device using existing battery monitoring components and other components of the electronic device.

The present invention provides for more accurate battery fuel gauging than conventional approaches in a number of ways. For example, instead of calibrating the fuel gauge for a 'lowest common denominator' or most common chemistry, the present invention provides adaptive fuel gauging that adjusts or adapts to each specific, determined battery chemistry. By adapting the fuel gauging to the chemistry, fuel gauging is not only more accurate but also accommodates a more precise end of discharge cut-off determination. With a more precise cut-off, a battery's end-of-life is more readily determinable, thus allowing for various battery chemistries to be drained to a more optimal level. The present invention also can enable feedback to be given to the user on battery type choices that might affect the performance of the electronic device. Additionally, the present invention can be employed to prevent accidental attempts to re-charge batteries having nonrechargeable chemistries.

The accuracy of the battery fuel gauging according to the present invention is further enhanced relative to conventional approaches by utilizing operational mode information for the electronic device. The operational mode, especially a 'high' load operation versus a 'low to moderate' load operation, can significantly affect the monitored characteristics of the battery. The present invention employs operational mode information to adjust the fuel gauging, thereby improving the accuracy of the readings. These and other features and advantages of the invention are detailed below with reference to the following drawings.

BRIEF DESCRIPTION OF THE DRAWINGS

The various features and advantages of the present invention may be more readily understood with reference to the following detailed description taken in conjunction with the accompanying drawings, where like reference numerals designate like structural elements, and in which.

MODES FOR CARRYING OUT THE INVENTION

The present invention is a method of adaptive fuel gauging and a fuel gauge apparatus for electronic devices, and an electronic device that incorporates the method and/or apparatus. The method and apparatus of the present invention use battery chemistry determination or identification to provide more accurate fuel gauging for electronic devices that accept any one of a plurality of different battery chemistries. In one or more embodiments, the method and apparatus of the present invention combine battery chemistry determination or identification with electronic device operational mode determination to provide more accurate fuel gauging for such devices. The fuel gauging adapts to the determined chemistry and, in some embodiments, then also takes into account or adjusts for an operational mode of the device. In addition to improved fuel gauging accuracy, the present invention improves battery end of life detection and can even be used to prevent attempts to accidentally recharge non-rechargeable batteries. Advantageously, with many electronic devices, the method and apparatus of the present invention can be implemented as a firmware upgrade to these electronic devices without requiring hardware modifications. Moreover, battery chemistry and fuel gauge adaptation, as well as the mode determination, can be performed many times during device operation without compromising battery life and without interfering with device operation or user enjoyment of the electronic device.

The method and apparatus of the present invention are applicable to all battery powered electronic devices, especially those that are capable of using battery types available in multiple different battery chemistries. In addition, the method and apparatus are applicable to electronic devices that can accept either re-chargeable or non-rechargeable battery types. Examples of different battery chemistries available for use in electronic devices include, but are not limited to, alkaline, high drain alkaline, nickel-metal hydride (NiMH), nickel-cadmium (NiCd), and photo lithium (Li—$FeS_2$), all of which are commercially available in a variety of form factors including an 'AA' form factor. Examples of battery-powered devices to which the method and apparatus of the present invention are beneficial include, but are not limited to, notebook and laptop computers, hand-held computers and personal digital assistants (PDAs), digital cameras, including video cameras, and cellular telephones.

In one aspect of the invention, a method 100 of fuel gauging that adapts to battery chemistry is provided. In one or more embodiments, the method 100 of the present invention advantageously can combine battery chemistry determination with detection of an operational mode of the device as a basis for adapting the fuel gauging. The method 100 of adaptive fuel gauging improves overall fuel gauge accuracy as compared to a conventional fuel gauging approach.

Figure 1:
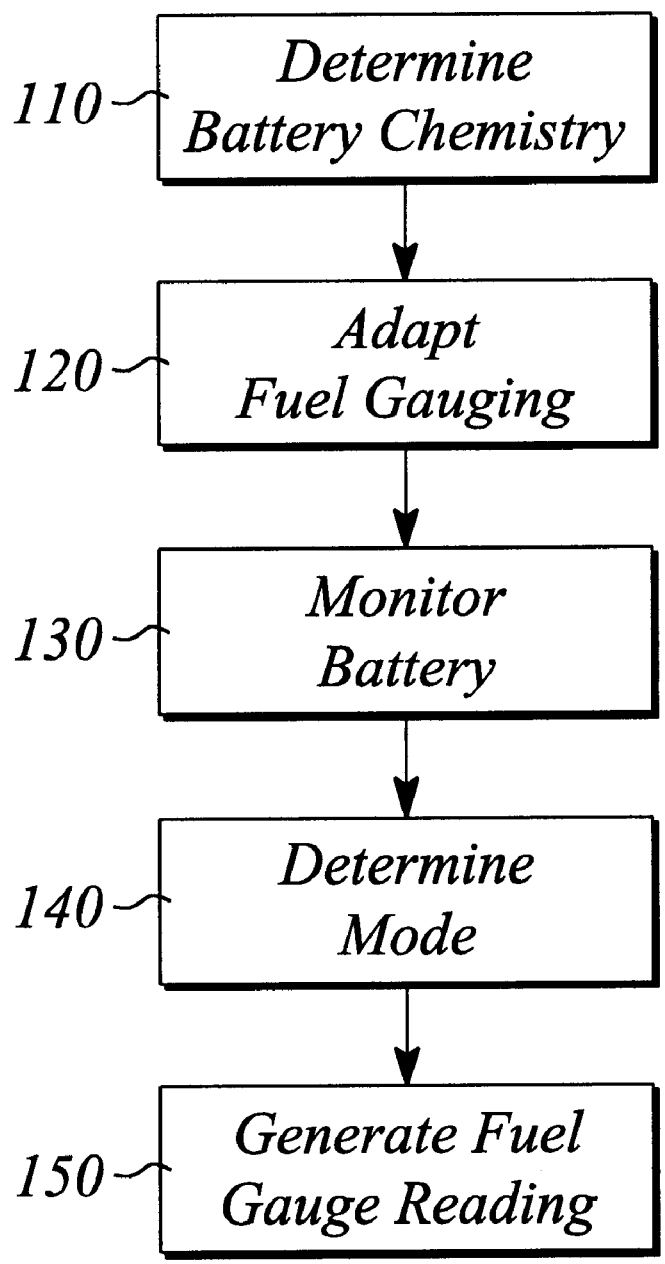
FIG. 1 illustrates a flow chart of a method of fuel gauging according to a preferred embodiment of the present invention.

FIG. 1 illustrates a flow chart of the method 100 of fuel gauging of the present invention, according to one or more preferred embodiments. The method 100 of fuel gauging comprises determining 110 battery chemistry. In the step of determining 110 battery chemistry, a characteristic or set of characteristics for the battery are measured under one or more battery load conditions. In a preferred embodiment, the measurements are performed in situ and can be performed using conventional battery monitoring circuitry of the electronic device. Results of the measurement are compared to 'known' or predetermined characteristics for a set of battery chemistries that may be used by the device. From the comparison, a determination 110 of battery chemistry is made. In the preferred embodiment, the comparison uses a look-up table that stores the characteristics of candidate battery chemistry characteristics.

Ideally, the battery chemistry needs to be determined only when the battery has been replaced. However, in practice, the step of determining 110 preferably is performed during each power-up or 'boot' sequence carried out by the electronic device. In addition, for electronic devices that can remain operational while the battery is replaced, the step of determining 110 is preferably performed each time a battery is replaced or for example, a battery compartment is opened or accessed. Battery chemistry determination 110 also can be performed at other times during device operation and still be within the scope of the present invention.

Figure 2:
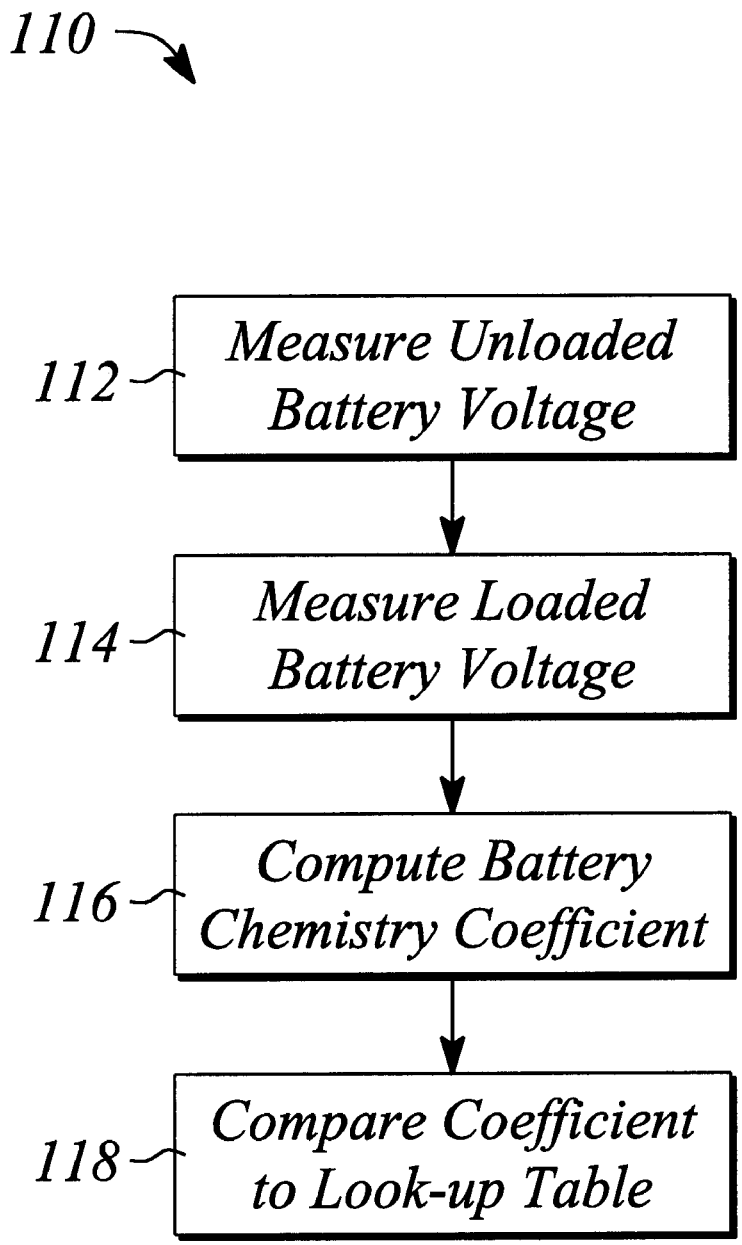
FIG. 2 illustrates a flow chart of an embodiment of a step of determining battery chemistry of the method of fuel gauging illustrated in FIG. 1.

There are a variety of ways to determine 110 battery chemistry, all of which are within the scope of the present invention. A flow chart of a preferred embodiment of the step of determining 110 of the present invention is illustrated in FIG. 2. In the preferred embodiment, the step of determining 110 comprises measuring 112 the battery voltage in an 'unloaded' or idle condition to produce a measured unloaded battery voltage value. The step of determining 110 further comprises measuring 114 the battery voltage in a 'loaded' condition to produce a measured loaded battery voltage value. An unloaded condition is defined as a situation wherein the battery is subjected to a low current drain while a loaded condition is defined as a situation wherein the battery is subjected to a moderate to high current drain. Alternatively, a voltage that is proportional to the battery voltage may be measured 112, 114 instead of the actual voltage across the battery itself.

The preferred embodiment of the step of determining 110 further comprises computing 116 a battery chemistry coefficient from measured values of the loaded and unloaded battery voltages. One such battery chemistry coefficient is computed by taking a ratio of the measured 112, 114 values of the unloaded and loaded battery voltage. One skilled in the art can readily devise other useful battery chemistry coefficients all of which are within the scope of the present invention. The main function of the battery chemistry coefficient is to provide a reliable means for distinguishing between various battery chemistries.

The preferred embodiment of the step of determining 110 further comprises comparing 118 the battery chemistry coefficient to a set of candidate battery chemistry coefficients or, more particularly, to a set of battery chemistry coefficient ranges for candidate battery chemistries. Preferably, the coefficient ranges are stored in a look-up table. The step of comparing 118 results in a choice of a particular battery chemistry from among the possible, candidate battery chemistries represented by the coefficient ranges in the look-up table. In essence, the step of comparing 118 produces a 'best guess' of an actual battery chemistry, the accuracy of which is limited only by an effective discrimination power or capability of the battery chemistry coefficient and the accuracy and applicability of look-up table data.

While defined hereinabove, the actual definition of the unloaded condition and the loaded condition is usually device specific. As already mentioned, the unloaded condition should represent a lower load or current drain on the battery than is evident in or represented by the loaded condition. Preferably, a relative difference in battery load levels between the loaded and unloaded conditions is relatively high. More preferably, the relative difference in load levels is as high as is normally experienced by the battery during normal device operation.

For example, if the device is a digital camera, an unloaded condition might be the load experienced by the battery before or immediately following a start-up process. A loaded condition might be defined as the load condition experienced by the battery during a lens extension or while charging a capacitor that powers the flash bulb. In another example, a loaded condition for a compact disk (CD) player might be defined to occur when 'spinning up' the CD. Likewise, the unloaded condition for the CD player might be defined as occurring when the CD is not spinning, but the player is ON. In general any two relatively repeatable but different load conditions normally present in the device can be used as the loaded and unloaded conditions. However in general, the greater the difference in load levels, the more reliable will be the results of the step of determining 110.

Given that the definition of unloaded and loaded conditions are device specific, the coefficient ranges in the look-up table are likewise device specific. Typically, it is preferred that the look-up table coefficient ranges be generated empirically. That is, preferably the look-up table coefficient ranges are generated for the specific loaded and unloaded conditions to which the battery is subjected in the device. This way, the subsequent application of the step of determining 110 results in an accurate determination of battery chemistry. One skilled in the art is familiar with the construction and use of this sort of empirically derived look-up table for an electronic device.

As mentioned hereinabove, other methods beyond that described hereinabove for determining battery chemistry are applicable to the step of determining 110. For example, Bean et al., U.S. Pat. No. 6,215,275, incorporated herein by reference, discloses a method of battery chemistry determination or identification that utilizes a simple test circuit in conjunction with a microcontroller that measures several distinct voltages across a battery to determine battery chemistry. In another example, Bean et al., in a co-pending application entitled "A Method Of Battery Chemistry Identification Through Analysis Of Voltage Behavior", Ser. No. 09/859,015, which was filed May 14, 2001, disclose several in situ measurements of battery voltages under various loaded and unloaded battery conditions for battery chemistry determination. The described and cited methods, as well as any other method that one skilled in the art might devise to determine battery chemistry of a battery inserted into an electronic device, are each within the scope of the present invention.

The method 100 further comprises adapting 120 the fuel gauging to the battery chemistry identified in the step of determining 110. The method 100 employs a fuel gauge algorithm that relates battery-characteristic measurements to a relative battery charge level. In one or more embodiments, a set of different fuel gauge algorithms is employed, wherein each algorithm of the set is specifically tailored to the characteristics or discharge profile of a particular battery chemistry in a particular electronic device. The fuel gauging is adapted 120 by choosing the corresponding algorithm from the set based on the determined 110 battery chemistry. In one or more preferred embodiments, one algorithm is employed that has a different parameter (or different set of parameters) for each of the different battery chemistries. In the preferred embodiments, the fuel gauging is adapted 120 by setting a value of each parameter(s) of the algorithm. Any such fuel gauge algorithm, or set thereof, that accommodates different chemistries is within the scope of the present invention.

The method 100 of fuel gauging further comprises monitoring 130 a characteristic of the battery while the electronic device is in use. The battery is monitored 130 as a function of time and measured values of the monitored 130 characteristic are generated. Preferably, the step of monitoring 130 comprises measuring one or more characteristics of the battery periodically. The frequency at which the characteristic is measured depends on the device and its use. If the measurement frequency is too slow, the fuel gauge will respond too slowly and may not be able to provide a user with useful fuel gauge information in a timely manner. On the other hand, if the measurement frequency is too high, the step of monitoring 130 can interfere with the operation of the device. In general, a measurement frequency on the order of once every 0.5 second to once every 5 seconds is typically sufficient for most fuel gauging applications for most battery powered devices. Measurement frequency ranges greater than and less than every 0.5 to 5 seconds are also within the scope of the present invention. One skilled in the art can readily determine an appropriate monitoring frequency for a given device without undue experimentation.

The step of monitoring 130 measures one or more of a number of different characteristics of the battery related to the relative charge level of the battery. Preferably, a battery voltage and/or a battery current are monitored 130 since these characteristics are relatively easy to measure and subsequently relate to battery charge level. More preferably, a battery voltage or a voltage proportional to the battery voltage is measured to produce measured data for the step of monitoring 130.

An analog to digital converter (ADC), or other similar component known in the art, can be used to measure battery voltage in the step of monitoring 130. One skilled in the art is familiar with monitoring batteries and, in particular, with monitoring the battery voltage with an ADC or other components in electronic devices. All such monitoring of characteristics of the battery that can provide information on the relative charge level of the battery is within the scope of the present invention.

In practice, a moving average or other similar statistical methodology that tends to smooth out the measured data obtained during the step of monitoring 130 is preferred over simply using individual measured values. The smoothing action of the moving average improves the results of the step of monitoring 130 by smoothing out spikes or noise in the monitored characteristic (e.g., battery voltage). The moving average preferably includes 2 to 10 values of the measured data (i.e., a present value and 1 to 9 previous values). More preferably, about 7 to 9 previous values are included in the moving average. A moving average having too many values can slow down the calculation of the moving average and can also slow down a response time of the moving average. Using too few values in the moving average may not sufficiently smooth out noise and or spikes in the data. One skilled in the art is familiar with moving averages and their use in smoothing noisy data.

The method 100 of fuel gauging further comprises determining 140 an operational mode of the electronic device. The operational mode of the electronic device can and does influence the monitored 130 characteristics of the battery. For example, the battery voltage is often lower in operational modes that draw high currents from the battery. Similarly, batteries often experience a phenomenon known as recovery following a short duration, high current or high drain event, such as a lens extension in the case of a digital camera. Following a short duration, high drain event, the voltage of a battery is momentarily lowered or depressed compared to a voltage before the event. After the event, the voltage level of the battery typically rises slowly to a somewhat higher level that is more comparable to the voltage level before the event. The slow rise in battery voltage is known as voltage recovery and is attributable to kinetics of the battery chemistry. Thus, a priori information or knowledge regarding the operational mode can enable such mode related fluctuations in the monitored characteristics to be factored into the fuel gauging used in the device. In any event, as one skilled in the art can readily recognize, the operational modes are device specific.

In the preferred embodiment, actual operational modes of the device are grouped according to their respective effects on battery characteristics. For example, the modes might be grouped into two mode classes: high drain modes and low drain or quiescent modes. Grouping the modes reduces the number of modes that must be detected and accommodated without compromising the overall advantages of the method 100 of the present invention.

The effect of the mode on a battery characteristic, such as battery voltage, is then used by the method 100 in performing fuel gauging. Additionally, the step of determining 140 can enable the device to omit from fuel gauging the measured data taken during the step of monitoring 130 during and immediately following certain events. An example where the measured data might be omitted from the fuel gauging in a digital camera is the data corresponding to the time during and immediately following a lens extension or an electronic flash event (i.e., high drain modes).

In an alternate embodiment of the method 100, the step of adapting 120 is combined with the step of determining 140 an operational mode. In this embodiment, the step of adapting 120 takes into account both the operational mode and battery chemistry. In large part, which embodiment of the method 100 is used depends on how the fuel gauging is implemented. Normally, since the mode may change many times for each battery change, the fuel gauging implements battery chemistry determination 110 much less often than it implements operational mode determination 140. Therefore, the alternate embodiment is less preferred.

In some electronic devices, there may be only one operational mode or alternatively, the various operational modes are judged to have little effect on the fuel gauging. With such a device, little or nothing is to be gained by determining 140 the operational mode. Therefore, in yet another embodiment of the method 100, the step of determining 140 operational mode is omitted. One skilled in the art can readily choose between the embodiments of the method 100 and establish a frequency of applying the step of determining 140 operational mode without undue experimentation.

The method 100 of fuel gauging further comprises generating 150 a fuel gauge reading or result. The step of generating 150 uses the adapted fuel gauge algorithm to relate the measured values obtained in the step of monitoring 130 to the relative battery charge or fuel level. The adapted fuel gauge algorithm is the fuel gauge algorithm of the step of adapting 120. In addition, the step of generating 150 further uses the determined 140 mode, when applicable, to generate the fuel gauge reading. The fuel gauge reading may be made available to a user of the electronic device using some form of display. In general, fuel gauge readings can be displayed either in an alphanumeric format or in a graphical format. For example, a read-out on a display of '80% power remaining' is an example of an alpha-numeric format fuel gauge display, while a bar graph indicating remaining battery power is an example of a graphical format fuel gauge display. In some cases, the alphanumeric and graphical formats are combined to increase the usefulness of the displayed fuel gauge reading to the user.

Fuel gauge displays having graphical formats come in a variety of styles and are by far the most prevalent type or style of fuel gauge display. Most of the graphical-format fuel gauge displays can be classified as being either an iconic display or a graph display. An iconic fuel gauge display provides a relatively coarse indication of remaining battery power while graph displays typically provide a more detailed graphical indication of remaining fuel. For purposes of discussion herein, mechanical meters and displays that mimic mechanical meters are grouped with the graph displays.

Figure 3A:
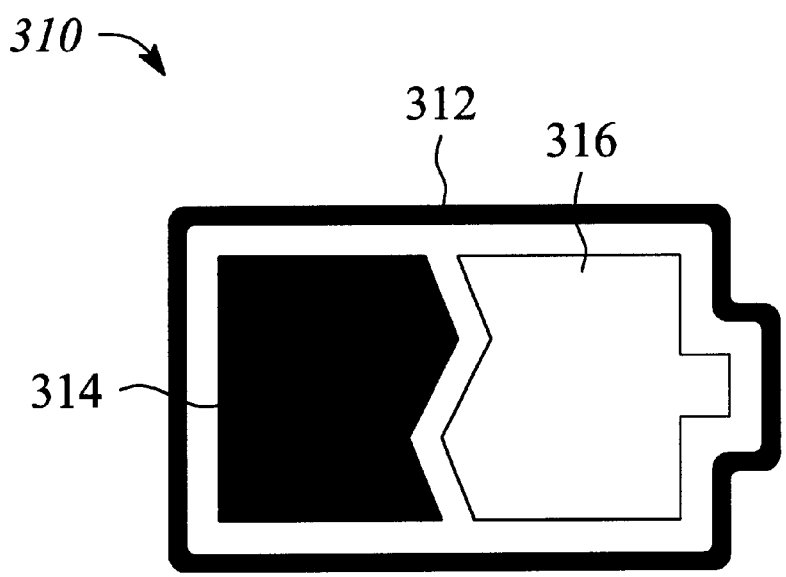
FIG. 3A illustrates an example of a three level iconic fuel gauge display.

FIG. 3A illustrates an example of a typical iconic fuel gauge display 310. The iconic display 310 illustrated in FIG. 3A is a so-called 'three-level' iconic display. The three-level iconic display 310 comprises a first region 312, a second region 314, and a third region 316. Each region 312, 314, 316 can be either illuminated or not illuminated as a means of indicating or displaying a fuel gauge reading or result. Such a three-level, iconic, fuel gauge display 310 is capable of indicating that the battery is 'FULL' (i.e., fully charged), 'HALF FULL', or 'EMPTY'.

For example, if all three regions 312, 314, 316, of the iconic display 310 illustrated in FIG. 3A are simultaneously illuminated, the battery charge level is indicated to be 'FULL'. If only the first and second regions 312, 314 are illuminated, the fuel gauge display 310 indicates that the battery is 'HALF FULL' while the battery is considered to be 'EMPTY' or fully discharged when only the first region 312 is illuminated. The iconic display 310 illustrated in FIG. 3A indicates a fuel gauge reading of 'HALF FULL', by way of example only, wherein the illumination is depicted by the dark shading. One skilled in the art is familiar with other iconic displays useful for fuel gauging, including ones that have more or less levels than the three-level iconic display 310. All such iconic displays are within the scope of the present invention.

Figure 3B:
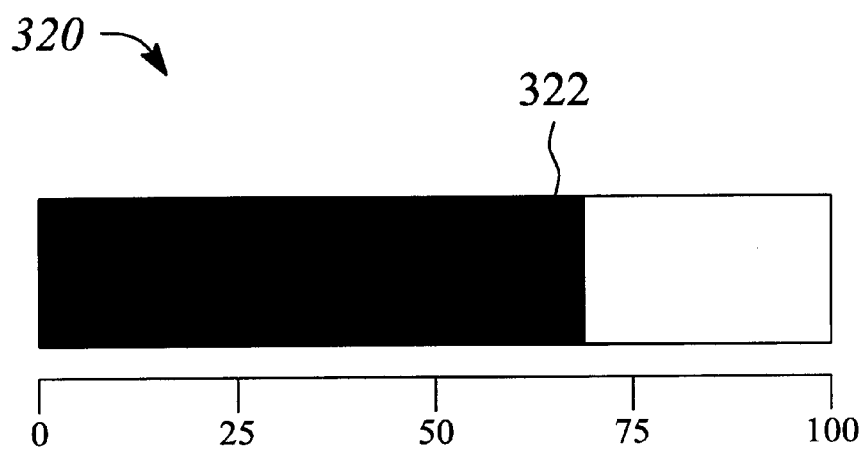
FIG. 3B illustrates an example of a graph style fuel gauge display.

FIG. 3B illustrates an example of a graph-style fuel gauge display 320. In particular, FIG. 3B illustrates an example of a bar-graph fuel gauge display 320. The bar-graph fuel gauge display 320 has a bar 322 (depicted by dark shading), the length of which varies according to an amount of power remaining in the battery based on the generated 150 reading. Thus, the bar 322 of the bar-graph display 320 is longest when the battery is 'FULL' and shortest when the battery is 'EMPTY'. Typically, the length of the bar 322 can be varied linearly or nearly linearly as a function of the fuel gauge reading, thereby providing the user with a more precise indication of remaining power than can be accommodated by the typical iconic display 310. One skilled in the art is familiar with other graph-style displays that are useful for displaying fuel gauging results including, not limited to, pie charts, line graphs, and area or region graphs. All such graph-style displays are within the scope of the present invention.

As mentioned hereinabove, the electronic device can use the fuel gauge reading to control device operation with respect to a cut-off point in the battery discharge profile. For example, if the battery charge level, based on the generated 150 fuel gauge reading or result, is found to be below the cut-off point, the electronic device can be disabled or possibly just prevented from completing a normal start-up or 'boot' process. Thus, upon detecting a battery charge level at or below cut-off, advantageously the electronic device can suspend the start-up process and begin a shutdown process. Equivalently, if the fuel gauge reading falls below the cut-off during operation, advantageously an automatic shutdown process can be initiated. As mentioned earlier, automatic detection of the cut-off condition in the battery charge level using the. fuel gauging method 100 of the present invention can help to prevent loss of data or other problems associated with attempting to operate the device with insufficient battery power.

Figure 4:
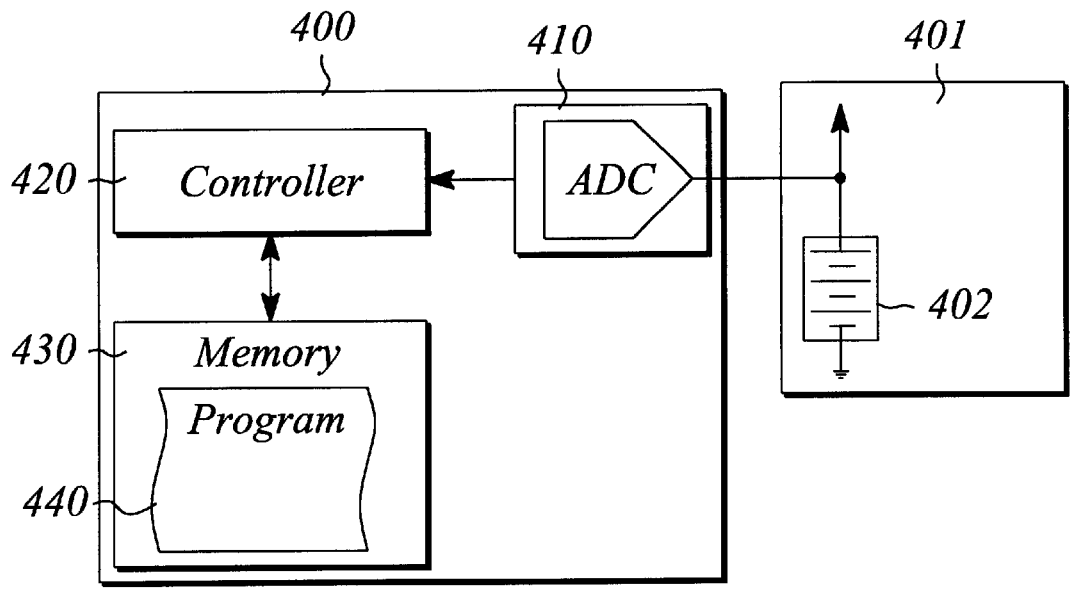
FIG. 4 illustrates a block diagram of an adaptive fuel gauge apparatus of the present invention.

In another aspect of the present invention, a fuel gauge apparatus 400 that adapts to battery chemistry is provided. The apparatus 400 is used in conjunction with a typical electronic device 401 having a battery 402, wherein the battery has any one of a plurality of different battery chemistries. FIG. 4 illustrates a block diagram of the fuel gauge apparatus 400 used in conjunction with the electronic device 401. The fuel gauge apparatus 400 comprises a battery monitor 410 and a controller 420. The battery monitor 410 monitors a characteristic of the battery 402 and outputs measured data. The controller 420 of the apparatus 400 implements adaptive fuel gauging that adapts to a determined battery chemistry of the battery 402 and when applicable, to a determined operational mode of the device 401.

For example, the battery monitor 410 can monitor a battery characteristic, such as a voltage of the battery 402 or a voltage that is proportional to the battery voltage. Given a characteristic, one skilled in the art can readily determine an implementation for the battery monitor 410 without undue experimentation. For example, if the characteristic being monitored is a voltage, an analog to digital converter (ADC) can be used as the battery monitor 410. An ADC is illustrated in FIG. 4 as the battery monitor 410 by way of example only. The measured data that is produced by the battery monitor 410 is communicated to the controller 420.

The controller 420 receives the measured data and preferably implements the method 100 of the present invention using the measured data. In particular, the controller 420 determines the chemistry of the battery 402. The battery chemistry is determined using the measured data supplied by the battery monitor 410 according to any of the ways described hereinabove for battery chemistry determination. Preferably, the controller 420 determines the chemistry of the battery 402 only when the battery 402 in the device 401 has been removed or replaced. More preferably, the controller 420 determines battery chemistry when power is applied to the device 401 (i.e., when the device 401 is switched 'ON') and immediately following when a battery access door or battery compartment cover of the device 401 is opened.

Once the chemistry has been determined, the controller 420 adapts the fuel gauging to the determined chemistry. The fuel gauging can be adapted in any of several ways. In one or more embodiments, the fuel gauging is adapted by employing a set of different, unique fuel gauge algorithms, one algorithm for each battery chemistry, and choosing the fuel gauge algorithm from the set that corresponds to the determined chemistry. In other embodiments, values for parameters of a fuel gauge algorithm are adjusted or set to achieve adaptation according to the determined chemistry. In still other embodiments, a mixture of unique algorithms and adjustable parameters is used.

The controller 420 also can determine an operational mode of the device 401. The adapted fuel gauging implemented by the controller 420 employs the measured data to produce a fuel gauge result or reading. The adapted fuel gauging also may employ the determined operational mode, where applicable, in the production of the fuel gauge reading. Alternatively, the fuel gauging can be adapted to both the operational mode and the chemistry, in which case the fuel gauge reading is produced from just the measured data. If the fuel gauging is adapted to both operational mode and chemistry, the adaptation preferably occurs every time the mode changes in addition to every time the battery 402 is removed and replaced (i.e., a battery compartment is accessed) and/or the device is turned 'ON'.

In a preferred embodiment, the apparatus 400 further comprises a memory 430, and a computer program 440 stored in the memory 430. The computer program 440 preferably comprises instructions that implement the method 100 of adaptive fuel gauging of the present invention. In the preferred embodiment, the controller 420 executes the computer program 440 to implement the adaptive fuel gauging.

Figure 5:
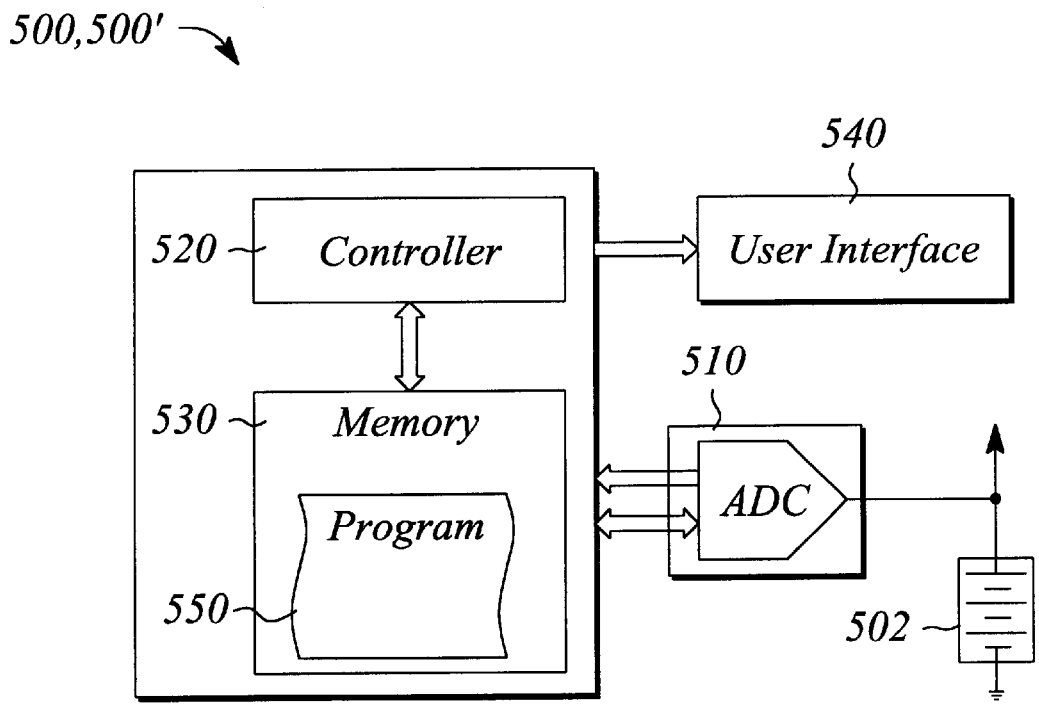
FIG. 5 illustrates a block diagram of an electronic device having adaptive fuel gauging of the present invention.

In yet another aspect of the invention, an electronic device 500 having adaptive fuel gauging is provided. The electronic device 500 has a battery and is capable of using any one of a plurality of different battery chemistries. FIG. 5 illustrates a block diagram of an electronic device 500 having adaptive fuel gauging. The device 500 comprises a battery 502, a battery monitor 510, a controller 520, a memory 530, a user interface 540, and a computer program 550 stored in the memory 530. The computer program 550 implements adaptive fuel gauging, wherein the fuel gauging is adapted to the chemistry of the battery 502. Preferably, the computer program 550 implements the method 100 of adaptive fuel gauging of the present invention. The computer program 550 can be stored in the memory 530 as software or firmware.

The battery monitor 510 monitors a characteristic of the battery 502 and outputs measured data. The controller 520 executes the computer program 550 stored in the memory 530 and uses the data produced by the battery monitor 510. The controller 520 also controls the user interface 540 for the purposes of displaying fuel gauging results to a user of the device 500. The controller 520 is preferably a microprocessor or microcontroller. Alternatively, the controller 520 can be an application specific integrated circuit (ASIC) or a portion thereof. The controller 420 of the apparatus 400 may be similarly realized.

The memory 530 is preferably computer memory. More preferably, the memory 530 is read/write memory, such as conventional random access memory (RAM). The memory 530 allows for the temporary storage of data, such as that produced by the battery monitor 520, and of temporary variables associated with the computer program 550 execution. The memory 530 may also include some read-only memory (ROM) especially for storing the program 550 when the device 500 is turned 'OFF'. The memory 430 of the apparatus 400 may be similarly realized with respect to the computer program 440.

As mentioned above, the computer program 550 preferably implements the method 100. In particular, the computer program 550, when executed by the controller 520, determines a battery chemistry, adapts the fuel gauging to the chemistry, monitors the battery 502 using data from the battery monitor 510, determines the operational mode of the electronic device 500, and generates the fuel gauge results, all in accordance with any of the various embodiments described above. Although the computer program 550 is preferably implemented as firmware or software stored in the memory 530, the computer program 550 can be 'hard coded' in logic circuitry of the electronic device 500, such as in the form of a state machine and still be within the scope of the present invention.

The present invention takes advantage of the fact that many electronic devices already monitor battery voltage and implement a conventional fuel gauging algorithm in the form of a computer program. Adaptive fuel gauging of the present invention often can be realized in these conventional devices using existing device elements. Namely, the conventional fuel gauging of the electronic device 401 can be rendered adaptive according to the invention utilizing the battery 402, a battery monitor, a controller, memory, a computer program and a user interface already existing in the conventional electronic device 401 with an upgrade to the computer program, or otherwise with an upgrade to existing firmware, that implements the method 100 of the present invention. One embodiment of the electronic device 500 of the present invention actually is such an adaptation of a conventional device 401.

For illustrative purposes and to better understand the device 500, the apparatus 400 and the method 100 of the present invention, the electronic device 500 will be described with reference to a digital camera 500' preferred embodiment. The digital camera 500' comprises the battery 502, the battery monitor 510, the controller 520, the memory 530, and the user interface 540, as described above with respect to the electronic device 500. The digital camera 500' further comprises the computer program 550 that implements the method 100 of adaptive fuel gauging of the present invention. The digital camera 500' yet further comprises an optical subsystem (not illustrated). In this embodiment, the optical subsystem comprises a lens that can be extended.

The example digital camera 500' embodiment accepts and operates with 'AA' format batteries having any one of three different battery chemistries: alkaline (ALK), high-energy lithium (HELi) and nickel-metal hydride (NiMH). Furthermore, the digital camera 500' user-interface 540 comprises a display that will be described with reference to a three-level iconic fuel gauge display similar to the one illustrated in FIG. 3A. Therefore, a fuel gauge reading generated by fuel gauging in the digital camera 500' example will correspond to and be displayed as 'FULL', 'HALF FULL' or 'EMPTY'.

The digital camera 500' of this example has operational modes that can be classified into three operational mode classes that are described further below. For simplicity of discussion, the mode classes will be referred to herein below as simply 'modes' of which there are three. For purposes of discussion, the three operational modes of the digital camera 500' are called STARTUP, PREVIEW, and NORMAL.

The STARTUP mode occurs for a short period of time during a 'start-up' process executed by the camera 500' immediately after power is applied (i.e., the camera is turned 'ON'). The STARTUP mode is characterized by a relatively low drain battery condition and with batteries that typically have been sitting in the unloaded state immediately prior to the start-up process. The PREVIEW and NORMAL modes encompass all normal operational modes that can occur during the operation of the camera 500' once the start-up process has finished. The PREVIEW mode subjects the battery 502 to a relatively high drain condition and generally includes operational situations such as a lens extension, an image recording or capture event, and a 'live video preview' of an imaged subject employing an image liquid crystal display (LCD) of the user interface 540 of the camera. Like the STARTUP mode, the NORMAL mode is characterized by a relatively low drain condition, but different from the STARTUP mode, the NORMAL mode includes situations where the camera 500' has been operating and draining the batteries continuously for a period of time.

The fuel gauging produces and uses an adapted fuel gauge algorithm to generate the fuel gauge reading. The adapted fuel gauge algorithm in this example compares a measured value of a battery voltage to several threshold values to generate a fuel gauge reading. Since there are three different chemistries, three different operational modes, and three different battery levels, the fuel gauging uses a total of twenty-seven threshold values. The threshold values are divided into three sets of threshold values, one set for each of the battery chemistries. Within each of the sets there are three subsets of threshold values, one subset for each operational mode. Each subset has three individual threshold values. A first threshold value in each subset of each set corresponds a 'FULL' battery level reading. A second threshold value in each subset of each set corresponds to a 'HALF FULL' battery level reading and a third threshold value in each subset of each set corresponds to an 'EMPTY' battery level reading. Thus, for the example camera 500', there is a first set of nine threshold values for an alkaline (ALK) battery chemistry, a second set of nine threshold values for a high-energy lithium (HELi) battery chemistry, and a third set of nine threshold values corresponding to a nickel-metal hydride (NiMH) battery chemistry.

The fuel gauging implemented by the computer program 550 is adapted by selecting one of these sets of nine threshold values based on a determined chemistry. Once the set has been selected, parameters of a fuel gauge algorithm are established using the selected set of threshold values to produce the adapted fuel gauge algorithm. The adapted fuel gauge algorithm then chooses among the subsets within a set of threshold values according to a determined operational mode provided to the algorithm by the computer program 550. For example, if the operational mode is determined to be STARTUP, a first subset of threshold values of the set is chosen that corresponds to STARTUP mode. Alternatively, if the mode is determined to be PREVIEW, a second subset is chosen while if the mode is determined to be NORMAL a third subset is chosen.

Having chosen a subset based on operational mode, the adapted fuel gauge algorithm then compares the measured value to the three threshold values within the subset. If the measured value is greater than a first threshold value, a reading corresponding to 'FULL' is generated. If the measured value is less then or equal to the first threshold value but greater than a second threshold value of the subset, a reading corresponding to 'HALF FULL' is generated. A reading corresponding to 'EMPTY' is generated if the measured value is less than or equal to the second threshold value of the subset. A measured value that is less than or equal to a third threshold value indicates that a cut-off point of the battery has been reached or exceeded. In this case, the fuel gauge algorithm generates a reading corresponding to 'EMPTY' along with an indication of having detected that the battery has reached the cut-off point.

Of course, the definitions given above for specific battery chemistries, operational modes, and battery level readings are for the digital camera 500' example embodiment and are included herein for illustrative purposes only. They are not intended to limit the scope of the present invention in any way. The modes will vary from one camera type to another and from one electronic device type to another. Likewise, chemistries that may be used and the battery level readings that are generated will vary from one camera type to another. One skilled in the art can readily define appropriate operational modes or mode classes for a given electronic device, define battery level readings, and choose useable or allowed chemistries without undue experimentation.

When power is applied (i.e., the camera is switched 'ON'), the camera 500' initiates the start-up process and begins executing the method 100 of fuel gauging of the present invention. In particular, the camera 500' performs the step of determining 110 battery chemistry. To determine battery chemistry in this example, the camera 500' measures 112 the battery voltage value using the battery monitor 510 before a lens extension and measures 114 the battery voltage several times during the lens extension. The measured 112 voltage value obtained before the lens extension represents a value for an unloaded condition of the battery while the several measured 114 voltage values obtained during the lens extension represent values for a loaded condition. The several loaded condition values are averaged to produce an average loaded condition value. The unloaded condition value is called InitBatMeas while the average loaded condition value is called avgLoadedBatMeas. A ratio of the InitBatMeas and avgloadedBatMeas values is computed 116 thus yielding a battery chemistry coefficient called BatChem for this example. The battery chemistry coefficient BatChem is then compared 118 to ranges of values stored in a look-up table that is included in the memory 530, for example. The ranges are indicative of each of the battery chemistries (i.e. ALK, HELi, and NiMH) that can be used with the digital camera 500' example.

To illustrate the comparison 118 process, consider the following pseudo-code segment. The pseudo-code segment represents one possible way of determining 110 battery chemistry from the computed 116 battery chemistry coefficient BatChem for the preferred digital camera 500' embodiment. The pseudo-code segment assigns a value to a variable BatType that indicates the determined 110 battery chemistry.

If (BatChem>AlkLimit) then BatType=ALK,

Else if (avgLoadedBatMeas>HELiLimit) then BatType= HELi;

Else if ((BatChem+SCALE*InitBatMeas))<= NiMHLimit) then

BatType=NiMH,

Else if (((BatChem+SCALE*InitBatMeas)>NiMHLimit) and ((BatChem+InitBatMeas)<MaxBatLimit)) then If (PreviousBatType!=NULL) then BatType= PreviousBatType;

Else BatType=NiMH,

Else if (InitBatMeas>HELiLimit2) then BatType=HELi;

Else BatType=ALK;

where a previous determined battery chemistry PreviousBatType is the battery chemistry BatType from a last execution of the pseudo-code, a variable SCALE is an arbitrary scale factor, and variables AlkLimit, HELiLimit, NiMHLimit, MaxBatLimit and HELiLimit2 are empirically determined look-up table values that have been found to provide discrimination among battery chemistries given the specific application. For example in one application, the following values have been found to work as look-up table limit and scale factor values:

SCALE=0.828;

AlkLimit=145;

HELiLimit=75;

NiMHLimit=181;

MaxBatLimit=198;

HELiLimit2=77

The values listed hereinabove are in terms of 'counts' for a particular ADC and are presented for illustrative purposes only. The previous battery chemistry PreviousBatType equals 'NULL' for this example when it has not been assigned a value (e.g. when the pseudo-code is run for a first time).

In addition to determining 110 the battery chemistry using look-up table values, the example pseudo-code presented hereinabove illustrates by way of example one methodology for dealing with ambiguous areas in the range of values that can be measured for various battery chemistries. Advantageously, the example pseudo-code incorporates certain default decisions into the step of determining 110 to deal with possible ambiguities. In particular, under certain conditions as defined by the fourth 'if-statement' in the pseudo-code above, a determination 110 cannot be made with sufficient certainty for this example. Instead, when the ambiguous conditions are encountered, the example pseudo-code uses a previously determined battery hemistry (i.e., BatType=PreviousBatType) if one exists. If a previously determined battery chemistry does not exist (i.e., PreviousBatType=NULL) then the battery chemistry is assumed to be nickel-metal hydride (i.e., BatType=NiMH) when the ambiguous conditions are encountered. The choice of nickel-metal hydride is arbitrary and represents a 'safest' guess of battery chemistry under the ambiguous conditions. One skilled in the art is familiar with the use of such default conditions in decision trees using look-up tables, such as illustrated by the example pseudo-code above. Moreover, one skilled in the art can readily translate the pseudo-code segment hereinabove into an actual computer program using any one of a number of conventional computer programming languages without undue experimentation.

Once a battery chemistry has been determined 110 during the STARTUP mode, the digital camera 500' adapts the fuel gauging implemented by the computer program 550 to the determined battery chemistry by producing an adapted fuel gauge algorithm as described above. The computer program 550 then executes the step of monitoring 130 to have the battery monitor 510 measure the battery voltage. Since the digital camera 500' is still completing the start-up process, the operational mode is determined 140 to be the STARTUP mode. Essentially, the step of determining 140 mode can be omitted during the start-up process, since the mode is known a priori.

The computer program 550 generates a fuel gauge reading using the adapted fuel gauge algorithm. The adapted fuel gauge algorithm compares the measured voltage value to the three STARTUP mode threshold values associated with the determined 110 battery chemistry, as described above, and generates a fuel gauge reading that is then displayed by the user interface 540. The reading is displayed by illuminating the fuel gauge iconic display of the user interface 540 in a manner consistent with the reading as described with reference to FIG. 3A. Additionally, when it is detected that the battery cut-off point has been reached, the digital camera 500' initiates a shutdown process. Otherwise, the digital camera 500' completes the start-up process and becomes operational.

During operation, the digital camera 500' monitors 130 the battery voltage periodically, e.g., approximately once every two seconds. Each time the battery voltage is monitored 130, a measurement is taken of the battery voltage and a moving average that records the average battery voltage is updated within the computer program 550. The moving average is computed in the camera 500' from a current or most recent measured voltage value and eight most recent, previous values, for example. Thus, the moving average is a nine-point moving average for the example digital camera 500' embodiment.

In addition to updating the moving average, the operational mode of the camera 500' is determined 140 by the computer program 550. The adapted fuel gauge algorithm compares the moving average value to the three threshold values corresponding to the determined 140 mode, as described above. For example, if the mode is determined to be PREVIEW, the moving average is compared to the three PREVIEW mode threshold values. Alternatively, if the mode is determined to be NORMAL, the moving average value is compared to the three NORMAL mode threshold values.

The comparison made by the adapted fuel gauge algorithm embodied in the computer program 550 then produces a result in a manner analogous to that of the STARTUP mode, as described above. Thus, a fuel gauge reading corresponding to 'FULL', 'HALF FULL', or 'EMPTY' is generated from the moving average value. Likewise, the adapted fuel gauge algorithm produces an indication of whether or not the battery has reached cut-off. If the cut-off point is detected, the digital camera 500' still displays the 'EMPTY' level, but advantageously, the computer program 550 also initiates a shut-down process to protect any data stored in the memory 530 of the digital camera 500'.

In another embodiment, there is one set of threshold values for each operational mode of the digital camera 500'. During the step of adapting 120, the set is chosen based on the determined 140 operational mode. Then the subset of three threshold values is chosen for a subsequently or previously determined 110 battery chemistry. Therefore, each set comprises nine threshold values for each of the operational modes. Each set is further divided into three subsets, one for each of the three battery chemistries. Each subset has a separate value corresponding to a respective battery power level, 'FULL', 'HALF FULL', and 'EMPTY'.

In still another embodiment, the chemistry and the operational mode have been determined 110, 140 or otherwise are known. In this embodiment, the step of adapting 120 comprises choosing the set based on the combined determined chemistry and mode. Here, the set comprises three threshold values, one value in each set corresponding to the respective battery power level reading. One skilled in the art can devise other combinations of sets, all of which are also within the scope of the present invention. The threshold values for the different battery power levels, for each of the modes, and for each of the chemistries are determined empirically for the device, since these threshold values are device-specific.

In addition to the features and advantages related to fuel gauging, especially fuel gauging accuracy, described hereinabove, the method 100, apparatus 400 and electronic device 500, 500' of the present invention can advantageously distinguish a rechargeable battery type from a non-rechargeable battery type. Therefore, the method 100, apparatus 400 and device 500, 500' also can be used to implement 'safe' in-device battery recharging. For example, the apparatus 400 and the method 100 could provide information to a battery charging subsystem (not shown) in the electronic device 401 indicating whether the battery 402 can be safely charged based on the battery chemistry determination. Likewise, the built-in chemistry determination of the electronic device 500, 500' can be employed to self-detect whether the battery 502 is rechargeable and thereby indicate to a charging subsystem whether or not to allow re-charging. The battery charging subsystem of the device 401, 500, 500' uses the information to either connect or disconnect the battery 402 of the device 401 or the battery 502 of the electronic device 500, 500' from a battery charging source. In other words, if the battery 402, 502 is determined to be of a non-rechargeable type based on battery chemistry, the battery charging subsystem disconnects from the battery 402, 502 to prevent problems associated with attempting to charge a non-rechargeable battery. Moreover, the user interface 540 of the device 500, 500' can display a message such as "Non-rechargeable batteries detected Do not attempt to recharge." to warn the user of a problem.

Thus there have been described a novel method 100 of adaptive fuel gauging, a novel adaptive fuel gauge apparatus 400 for use in conjunction with battery powered electronic devices, and an electronic device 500, 500' having adaptive fuel gauging.

It should be understood that the above-described embodiments are merely illustrative of the some of the many specific embodiments that represent the principles of the present invention. Clearly, those skilled in the art can readily devise numerous other arrangements without departing from the scope of the present invention as defined by the following claims.

What is claimed is:

1. A method of fuel gauging for an electronic device that uses a battery for power, the battery being any one of a plurality of different battery chemistries, the method comprising:

determining a battery chemistry for the battery; and adapting the fuel gauging to the determined battery chemistry.

2. The method of claim 1, further comprising:

determining an operational mode of the electronic device, and wherein the step of adapting comprises further adapting the fuel gauging to the determined operational mode.

3. The method of claim 1, wherein the step of determining the battery chemistry comprises:

measuring a characteristic of the battery under a load condition; and comparing the measured characteristic to respective known characteristics for each battery chemistry of the plurality of different battery chemistries that may be used by the device, wherein a relationship between the measured characteristic and one or more of the respective known characteristics equates to the determined battery chemistry.

4. The method of claim 1, wherein the step of determining the battery chemistry comprises:

measuring a voltage of the battery in an unloaded condition to produce a measured unloaded battery voltage value;

measuring the battery voltage in a loaded condition to produce a measured loaded battery voltage value;

computing a battery chemistry coefficient from a ratio of the measured unloaded value and the measured loaded value; and comparing the computed battery chemistry coefficient to a set of battery chemistry coefficient ranges, each range of the set corresponding to a different candidate battery chemistry, wherein the determined battery chemistry is the candidate battery chemistry corresponding to the coefficient range which the computed coefficient falls within.

5. The method of claim 1, wherein the step of adapting the fuel gauging comprises using a different fuel gauge algorithm for each different, determined battery chemistry to gauge an amount of fuel in the battery.

6. The method of claim 1, wherein the step of adapting comprises using a fuel gauge algorithm and setting parameter values of the fuel gauge algorithm according to the determined battery chemistry to gauge an amount of fuel in the battery.

7. The method of claim 1, wherein the step of adapting the fuel gauging comprises choosing a set of threshold values from a plurality of sets of threshold values, each set corresponding to a different battery chemistry, the threshold values of each set representing battery fuel levels, and wherein the method further comprises monitoring a characteristic of the battery to produce measured data that can be compared to the threshold values in the chosen set.

8. The method of claim 1, further comprising:

monitoring a characteristic of the battery to produce measured data; and generating a fuel gauge reading, wherein the fuel gauge reading is a function of the determined battery chemistry and the measured data.

9. The method of claim 8, further comprising:

determining an operational mode of the electronic device when the characteristic was monitored, and wherein the step of adapting comprises further adapting the fuel gauging to the determined operational mode, such that the fuel gauge reading is further a function of the determined operational mode.

10. The method of claim 9, wherein the step of monitoring is performed periodically, and wherein the step of determining battery chemistry is performed less frequently than the step of determining the operational mode.

11. The method of claim 8, wherein the step of monitoring is performed periodically, and wherein the step of determining battery chemistry is performed each time the device is turned ON or each time the battery is replaced.

12. The method of claim 8, wherein the battery characteristic that is monitored is related to a relative charge level of the battery and is selected from one or both of battery voltage and battery current.

13. The method of claim 8, wherein the step of monitoring comprises calculating a moving average for the measured data.

14. The method of claim 2, wherein in the step of determining the operational mode, the mode is selected from relatively low battery drain, moderate battery drain and high battery drain modes.

15. The method of claim 1, wherein a rechargeable battery chemistry is distinguished from a non-rechargeable battery chemistry in the device.

16. A fuel gauge apparatus for use in conjunction with an electronic device that has a battery, the device being capable of using any one of a plurality of different battery chemistries, the apparatus comprising:

a battery monitor that monitors a characteristic of the battery and generates measured data; and a controller that receives the measured data and implements adaptive fuel gauging, the adaptive fuel gauging comprising a fuel gauge reading, a determined chemistry of the battery, and optionally a determined operational mode, wherein the fuel gauge reading is a function of the measured data, the determined battery chemistry and the optionally determined operational mode.

17. The fuel gauge apparatus of claim 16, further comprising:

a memory for storing the measured data from the controller; and a computer program stored in the memory, wherein the controller implements the adaptive fuel gauging by executing the computer program.

18. The apparatus of claim 17, wherein the computer program comprises instructions for determining the chemistry of the battery, determining the operational mode of the electronic device, and instructions for generating the fuel gauge reading from the determined chemistry, the determined operational mode and the measured data.

19. An electronic device with adaptive fuel gauging, the electronic device having a battery and being capable of using any one of a plurality of different battery chemistries, the device comprising:

a battery monitor that measures a characteristic of the battery;

a controller that receives the measured battery characteristic from the battery monitor;

a memory that provides temporary data storage for the controller;

a user interface that displays results produced by the controller; and a computer program stored in the memory that implements the adaptive fuel gauging, wherein the computer program comprises instructions that, when executed by the controller, determine a chemistry of the battery, adapt the fuel gauging to the determined chemistry, and generate a fuel gauge result at the user interface from data for the measured battery characteristic based on the adaptation.

20. The electronic device of claim 19, wherein the computer program further comprises instructions that determine an operational mode of the device when the data are measured, and further adapt the fuel gauging to the determined operational mode.

21. The electronic device of claim 19, wherein the computer program is stored in the memory as either firmware or software.

22. The electronic device of claim 19, wherein the computer program is incorporated into logic circuitry of the electronic device.

23. The electronic device of claim 19, wherein the electronic device is a digital camera that further comprises an optical subsystem that is controlled by the controller.

* * * * *